United States Patent
Palata et al.

(10) Patent No.: US 6,864,691 B2
(45) Date of Patent: Mar. 8, 2005

(54) CIRCUIT ARRANGEMENT FOR DETECTING THE CAPACITANCE OR CAPACITANCE CHANGE OF A CAPACITIVE CIRCUIT ELEMENT OR COMPONENT

(75) Inventors: Jaromir Palata, Friedrichshafen (DE); Joerg Schulz, Lustenau (AT)

(73) Assignee: i f m electronic GmbH, Essen (DE)

( * ) Notice: Subject to any disclaimer, the term of this patent is extended or adjusted under 35 U.S.C. 154(b) by 53 days.

(21) Appl. No.: 10/318,090

(22) Filed: Dec. 13, 2002

(65) Prior Publication Data

US 2003/0112021 A1 Jun. 19, 2003

(30) Foreign Application Priority Data

Dec. 14, 2001 (DE) .......................... 101 61 642
Feb. 4, 2002 (DE) .......................... 102 04 572

(51) Int. Cl.[7] ............................................. G01R 27/26
(52) U.S. Cl. ...................... 324/658; 324/672; 324/674; 324/676
(58) Field of Search ............................. 324/658, 686, 324/672, 674, 676, 677, 679

(56) References Cited

U.S. PATENT DOCUMENTS 6,194,903 B1 2/2001 Schulz

FOREIGN PATENT DOCUMENTS

DE 197 01 899 C2 10/1997
DE 197 44 152 A1 4/1999

*Primary Examiner*—N. Le
*Assistant Examiner*—John Teresinski
(74) *Attorney, Agent, or Firm*—Nixon Peabody LLP; David S. Safran

(57) ABSTRACT

A circuit arrangement for detecting the capacitance or capacitance change of a capacitive circuit element or component, in which there is a capacitive noise voltage compensation element, which corresponds to the sensor capacitor, represented as a noise voltage compensation capacitor, and a noise voltage compensation electrode of the noise voltage compensation capacitor, which corresponds to the first electrode of the sensor capacitor, is connected to the second electrode of a storage capacitor. The noise voltage compensation capacitor can be influenced in the same way as the sensor capacitor by the LF noise voltage. In this way, the adulteration of the measurement result by LF noise voltages which otherwise occurs no longer takes place.

6 Claims, 3 Drawing Sheets

CIRCUIT ARRANGEMENT FOR DETECTING THE CAPACITANCE OR CAPACITANCE CHANGE OF A CAPACITIVE CIRCUIT ELEMENT OR COMPONENT

BACKGROUND OF THE INVENTION

1. Field of the Invention

The invention relates to a circuit arrangement for detecting the capacitance or capacitance change of a capacitive circuit element or component. More specifically, the invention relates to a circuit arrangement for detecting the capacitance or capacitance change of a capacitive circuit element or component, including: a voltage source, at least one charging switch, at least one recharging switch, a control device which controls the charging switch and the recharging switch and which contains a clock generator, a storage capacitor, and an evaluation circuit connected to the storage capacitor.

2. Description of Related Art

Within the framework of the invention, "capacitance" means the capacitance value of a capacitive circuit element or component; a "capacitance change" consequently means a change of the capacitance value of a capacitive circuit element or component. "Detection" of the capacitance or capacitance change within the framework of the invention means both only qualitative detection and also quantitative detection. A "capacitive circuit element or component" within the framework of the invention means any circuit element and any component which has capacitive property called a capacitance. A "capacitive circuit element or component" within the framework of the invention however also means the electrode of a capacitive proximity switch in interaction with an influencing body. A "capacitive circuit element or component" within the framework of the invention also means, for example, the capacitance which represents conductive lines which capacitively interact with one another. Instead of using the term "capacitive circuit element or component", a sensor capacitor is used herein in describing the prior art and the present invention, without being associated with the limitation to a capacitor in the narrower sense.

Within the framework of the invention a "voltage source" means both an internal voltage source overall and also a terminal for an external voltage source.

The circuit arrangement underlying the present invention works according to the so-called "charge transfer principle," also called "charge transfer sensing," and is known, for example, from German patent 197 01 899 and 197 44 152 and their counterpart U.S. Pat. No. 6,194,903, which are incorporated herein by reference, and will be explained below in conjunction the drawing of FIG. 1.

FIG. 1 shows, in principle, an embodiment of a known circuit arrangement for detection, specifically for quantitative detection for the measurement of the capacitance of a sensor capacitor 1. The sensor capacitor 1 stands for a capacitive circuit element or component. The circuit arrangement includes a voltage source 2, wherein the expression "voltage source" means both a voltage source implemented within the circuit arrangement and also a terminal for this voltage source as previously mentioned. In the circuit arrangement shown in FIG. 1, there is only one terminal for an internal or external voltage source; nevertheless, this terminal for a voltage source is always labeled a voltage source 2 below.

The circuit arrangement shown in FIG. 1 further includes a charging switch 3, a recharging switch 4, a control device 5 which alternately controls the charging switch 3 and the recharging switch 4 and which contains preferably a clock generator (not shown), a storage capacitor 6, and an evaluation circuit 7 connected to the storage capacitor 6. In this embodiment, the control device 5 and the evaluation circuit 7 are combined into a control and evaluation unit 8.

As shown in FIG. 1, the voltage source 2 is connected, by closing the charging switch 3, to the first electrode 9 of the sensor capacitor 1, and the second electrode 10 of the sensor capacitor 1 is connected to the terminal of the voltage source 2, wherein the terminal has an opposite polarity from charging switch 3. In this embodiment, the connection of the second electrode 10 of the sensor capacitor 1 to the terminal of the voltage source 2, is to a common potential, specifically the ground potential 11. The above described connection of the sensor capacitor 1, the voltage source 2 and the charging switch 3 leads to the sensor capacitor 1 being charged by the voltage source 2 when the charging switch 3 is closed.

As can further be seen from FIG. 1, electrode 12 of the storage capacitor 6 is connected to the electrode 9 of the storage capacitor 1, which is connected to the charging switch 3, and the second electrode 13 of the storage capacitor 6 is connected, by closing the recharging switch 4, to the second electrode 10 of the sensor capacitor 1. The above described connection of the sensor capacitor 1, the recharging switch 4 and the storage capacitor 6 allows the sensor capacitor 1 to discharge onto the storage capacitor 6 with the charging switch 3 opened and the recharging switch 4 closed so as the charge stored in the sensor capacitor 1 is recharged or transferred onto the storage capacitor 6.

Finally, FIG. 1 shows that a discharging switch 14 connects the electrode 12 of the storage capacitor 6 and the electrode 9 of the sensor capacitor, with the ground potential 11. Before starting a measurement of the capacitance of the sensor capacitor 1, the storage capacitor 6 is first discharged in a defined manner by both the recharging switch 4 and also the discharging switch 14 being closed. When the recharging switch 4 and the discharging switch 14 are closed, the storage capacitor 6 is shorted via the recharging switch 4, the ground potential 11 and the discharging switch 14.

As known in the prior art about the "charge transfer principle" or "charge transfer sensing," the capacitance of the sensor capacitor 1 can be determined by the evaluation circuit 7 from the voltage on the storage capacitor 6 after a certain number of charging and discharging cycles, under the assumption that the voltage of the voltage source 2 and the capacitance of the storage capacitor 6 are known. This is because the voltage on the capacitor is proportional to its charge, as is generally known.

From the known voltage of the voltage source 2, the capacitance of the storage capacitor 6 and the number of charging and discharging cycles, hence, the capacitance of the sensor capacitor 1 can either be determined by the number of charging and recharging cycles, which is necessary for a certain voltage on the storage capacitor 6, or by the voltage on the storage capacitor 6 for a certain number of charging and recharging cycles.

The known circuit arrangements which work according to the charge transfer principle ("charge transfer sensing") have proven themselves in practice and are therefore extensively implemented. However, they are subject to one defect, specifically sensitivity to LF noise voltages. These LF noise voltages can adulterate the measurement result, as this will be explained below in conjunction with FIG. 2. The circuit arrangement shown in FIG. 2 corresponds completely to the circuit arrangement shown in FIG. 1, only with an addition of a LF noise voltage source 15.

It is assumed that the voltage source 2 provides an operating voltage $U_B$ of 5 V and the LF noise voltage source 15 generates a LF noise voltage $U_S$ with an instantaneous value of 1 V. The LF noise voltage potential $P_S$ should be positive on the second electrode 10 of the sensor capacitor 1 relative to the ground potential 11 for the observation instant; therefore, on the second electrode 10 of the sensor capacitor 1, there is a LF noise voltage $P_S$ of 1 V.

Furthermore, it is assumed that, before the start of the measurement cycle, the changeover switch 4 and the discharge switch 14 have been closed so that the storage capacitor 6 has been discharged in a defined manner, and that then the discharge switch 14 remains opened during the measurement cycle.

At this point, a first charging and recharging cycle will take place. First, the charging switch 3 is closed for a charging time $t_L$ which is sufficient for charging of the sensor capacitor 1, and then, after the charging switch 3 has been re-opened, the recharging switch 4 is closed for a recharging time $t_U$ which is sufficient for recharging the charge stored initially in the sensor capacitor 1 into the storage capacitor 6.

For the examination which now follows, it must be considered that the charging and recharging cycle time $t_{LUZ}$ of the charging and recharging cycle, which is generally slightly greater than the sum of the charging time $t_L$ and the recharging time $t_U$, is small compared to the period length $t_S$ of the LF noise voltage $U_S$, but that the measurement time $t_{MZ}$, therefore the number of charging and recharging cycles which is determined from the one measurement cycle, is small compared to the period length $t_S$ of the LF noise voltage $U_S$.

For the circuit arrangement shown in FIG. 1, without the LF noise voltage source 15 shown in FIG. 2, it holds that the electrode 9 of the sensor capacitor 1 is at the operating voltage potential $P_{UB}$ of the voltage source 2 at 5 V, and the second electrode 10 is at the ground potential 11 at 0 V, and that the charge of the sensor capacitor 1 which is recharged into the storage capacitor 6 after closing the recharging switch 4 results from the capacitance of the sensor capacitor 1 and the operating voltage $U_B$ of 5 V.

Recharging of the charge stored after charging in the sensor capacitor 1 onto the storage capacitor 6 leads to the voltage on the storage capacitor 6, which was 0 V at the start of recharging, to be increasing both during any recharging and also for any recharging which follows the first recharging. This also means mainly that during the second recharging less charge is recharged or transferred from the sensor capacitor 1 to the storage capacitor 6 than in the first recharging, during the third recharging less than in the second recharging, during the fourth recharging less than in the third recharging, and etc.

What is explained above must be considered in the determination of the capacitance of the sensor capacitor 1, from the voltage of the voltage source 2, the capacitance of the storage capacitor 6, from the number of charging and recharging cycles necessary for a certain voltage on the storage capacitor 6, and from the voltage on the storage capacitor 6 at a certain number of charging and recharging cycles.

It has been pointed out that, when the capacitance of the storage capacitor 6 is very large compared to the capacitance of the sensor capacitor 1, when the charging time $t_L$ is very small and when the measurement time $t_{MZ}$ is very small, the number of charging and recharging cycles which determines one measurement cycle is small. In such case, the above effects can be ignored. In practice, however, what was explained above cannot be ignored, but rather is considered in the determination of the capacitance of the sensor capacitor 1.

Now, if the LF voltage source 15 shown in FIG. 2 with a LF noise voltage $U_S$, as assumed above, with an instantaneous value of 1 V at the start of a recharging cycle, is active, and the instantaneous value of the LF noise voltage $U_S$ during the recharging cycle increases, it holds that not only the charge stored previously in the sensor capacitor 1 is recharged into the storage capacitor 6, but also a current caused by the time change of the LF noise voltage $U_S$ also flows through the sensor capacitor 1 into the storage capacitor 6, therefore, an addition charge is transported into the storage capacitor 6. The current which is caused by the time change of the LF noise voltage $U_S$ and which flows through the sensor capacitor 1 into the storage capacitor 6, will hereinafter be called the LF noise voltage fault current, and the charge thus transported in addition into the storage capacitor 6 will be called the LF noise voltage fault charge. The measurement result which can be determined from the voltage on the storage capacitor 6 after a certain number of charging and recharging cycles is therefore adulterated by the time change of the LF noise voltage $U_S$ because the voltage which arises on the storage capacitor 6 is no longer dependent only on the voltage of the voltage source 2 operating voltage $U_B$. Accordingly, the number of charging and recharging cycles and the capacitance of the storage capacitor 6 is now also dependent on the unwanted LF noise voltage $U_S$ with an unknown magnitude and the time change of the LF noise voltage $U_S$ during one recharging cycle, specifically on the LF noise voltage fault charge which has been caused thereby.

It previously mentioned, what is meant within the framework of the invention by a "capacitive circuit element or component" is a sensor capacitor. Consequently, instead of a "capacitive noise voltage compensation element," a noise voltage compensation capacitor will always be addressed below, and this should not be associated with a limitation to a capacitor in the narrower sense.

SUMMARY OF THE INVENTION

An object of the invention is now to embody and develop the circuit arrangement such that the above explained adulteration of the measurement result due to LF noise voltages no longer occurs.

The circuit arrangement of the invention in which the aforementioned object is achieved is first of all characterized essentially in that there is a capacitive noise voltage compensation element which corresponds to the capacitive circuit element or component, that the noise voltage compensation electrode of the noise voltage compensation element, wherein the electrode corresponds to the first electrode of the capacitive circuit element or component, is connected to the second electrode of the storage capacitor, and that the noise voltage compensation element can be influenced in the same way as the capacitive circuit element or component by the LF noise voltage.

The voltage source is connected, by closing the charging switch, to the electrode of the capacitive circuit element or component, and the second electrode of the capacitive circuit element or component is connected the voltage source's terminal of opposite polarity to the charging switch, such that when the charging switch is closed the capacitive circuit element or component is charged by the voltage source.

One electrode of the storage capacitor is connected or can be connected to the electrode of the capacitive circuit element or component, which is connected to the charging switch, and the second electrode of the storage capacitor is connected, via closing the recharging switch to connect the to the second electrode of the capacitive circuit element or component to the storage capacitor, such that when the charging switch is opened and the recharging switch is closed the capacitive circuit element or component will discharge onto the storage capacitor, i.e., the charge stored in the capacitive circuit element or component is recharged into the storage capacitor. After a certain number of charging and recharging cycles, and from the voltage on the storage capacitor, the evaluation circuit can determine the capacitance or capacitance change of the capacitive circuit element or component.

DETAILED DESCRIPTION OF THE INVENTION

The circuit arrangement in accordance with the invention, which has a noise voltage compensation capacitor connected as indicated above to eliminate the aboved-described effects of LF noise voltages causing adulteration of the measurement result, will be explained below in conjunction with FIG. 3.

Figure 1:
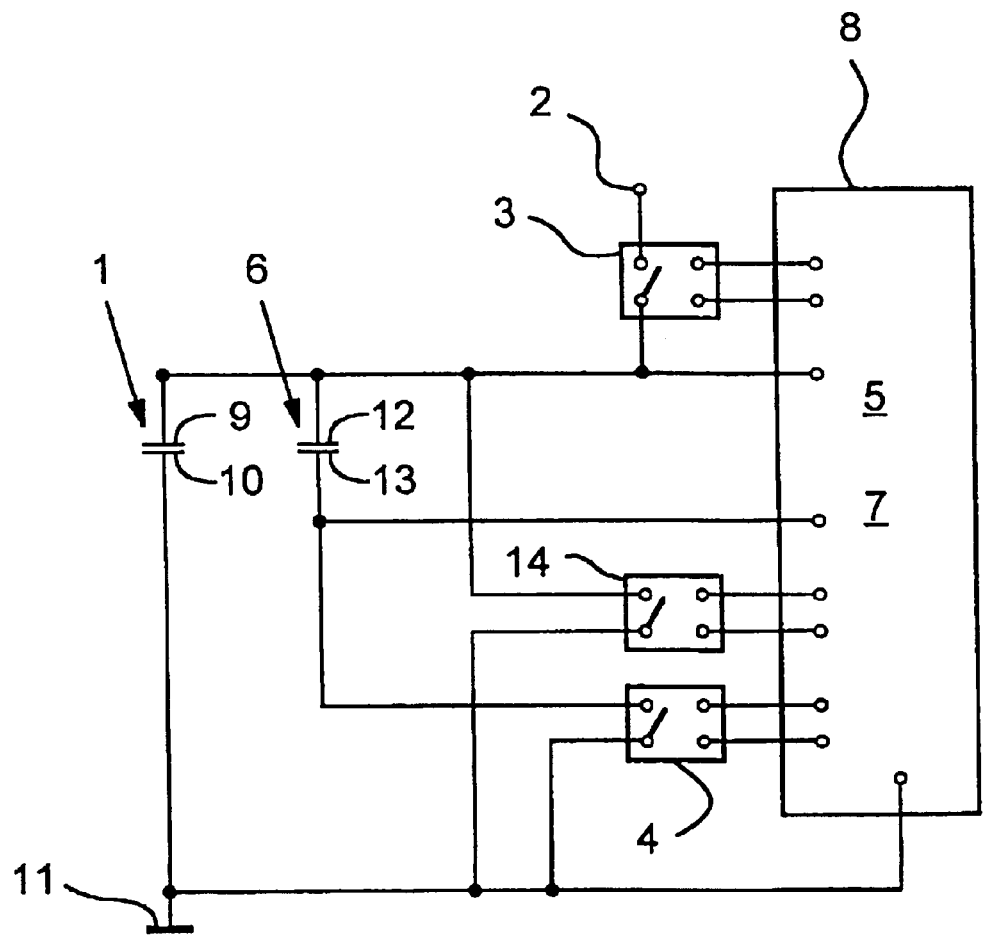
FIG. 1 illustrates a known circuit for detecting capacitance or capacitance change of a capacitive circuit element or component.
Figure 2:
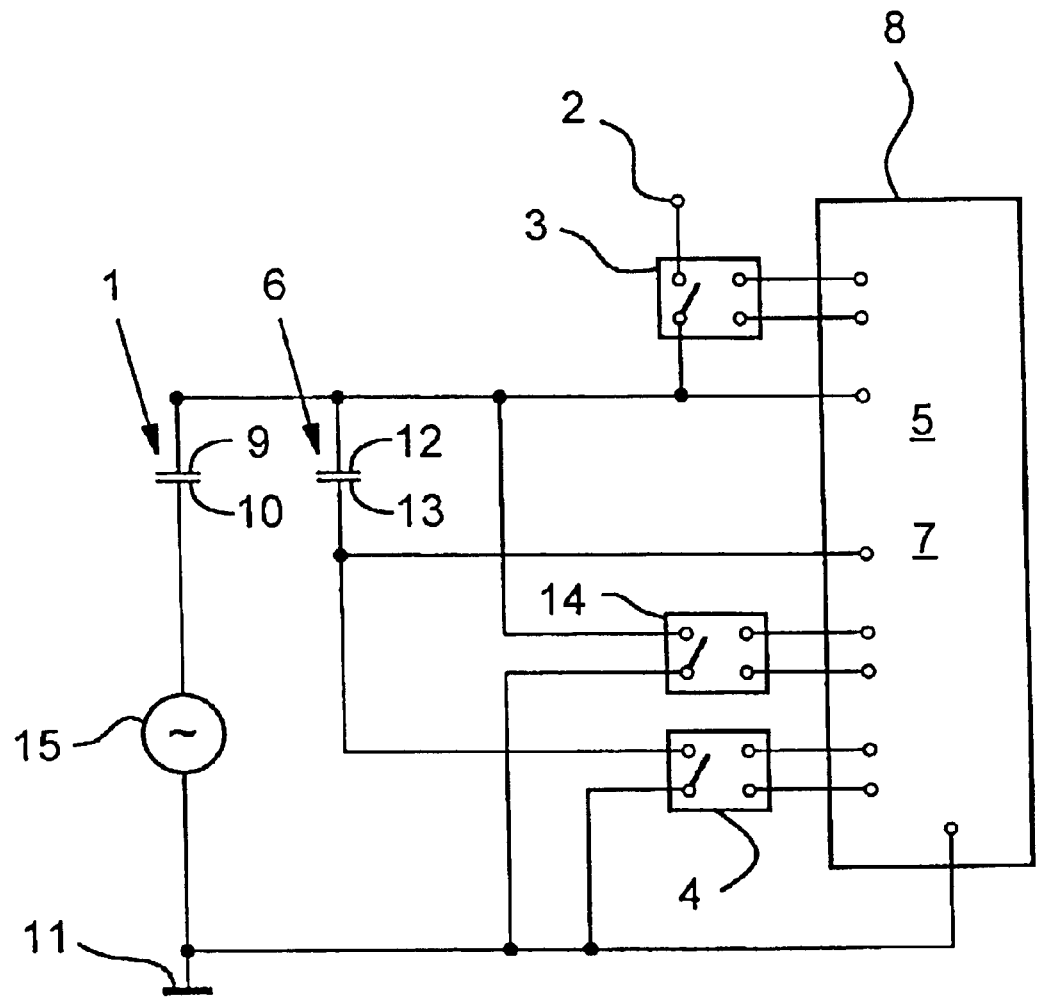
FIG. 2 illustrates the circuit of FIG. 1 with a Low Frequency noise source.
Figure 3:
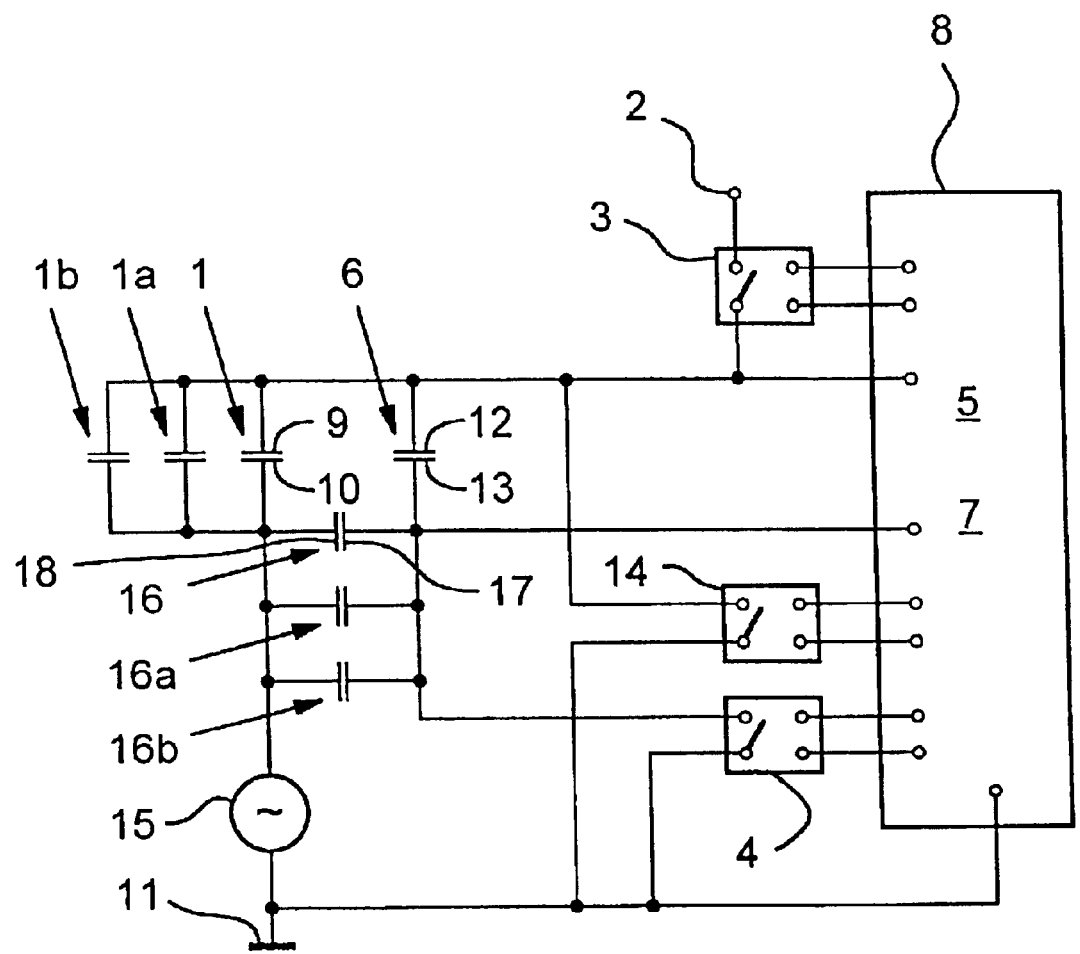
FIG. 3 illustrates an embodiment of the present invention with a Low Frequency noise source and a noise voltage compensation capacitor.

The circuit arrangement which is shown in FIG. 3 corresponds to the circuit arrangement shown in FIG. 2, with the addition of a noise voltage compensation capacitor 16, connected to the sensor capacitor 1. Note, that elements in FIGS. 1, 2, and 3 with identical numerical labels are essentially the same elements.

The noise voltage compensation capacitor 16 has a noise voltage compensation electrode 17 which is connected to the second electrode 13 of the storage capacitor 6. The noise voltage compensation capacitor 16 and the noise voltage compensation electrode 17 can be influenced in the same way as the sensor capacitor 1 and the first electrode 9 of the sensor capacitor 1 by the LF noise voltage $U_S$. This is shown in FIG. 3 by the LF noise voltage source 15 being connected both to the second electrode 10 of the sensor capacitor 1 and also to the second noise voltage compensation electrode 18 of the noise voltage compensation capacitor 16.

What was assumed above in conjunction with FIG. 2 applies exactly to the following examination with respect to the operating voltage $U_B$ of the voltage source 2 and the LF noise voltage $U_s$ of the LF noise voltage source 15. It is also assumed again that first the recharging switch 4 and the discharge switch 14 were closed so that the storage capacitor 6 has been discharged in a defined manner. However, at this point, the recharging switch 14 and the discharging switch 14 are opened, otherwise the charging switch 3 is also opened.

After opening the recharging switch 4 and with the charging switch 3 still opened, the storage capacitor 6 is essentially discharged as before, but both the sensor capacitor 1 and also the noise voltage compensation capacitor 16 have a charge which corresponds to their presumably identical capacitance and the instantaneous LF noise voltage $U_S$. The first electrode 9 of the sensor capacitor 1 and the first noise voltage compensation electrode 17 of the noise voltage compensation capacitor 16 have a ground potential 11 which is assumed to be 0 V, and the second electrode 10 of the sensor capacitor 1 and the second noise voltage compensation electrode 18 of the noise voltage compensation capacitor 16 have a LF noise voltage potential $P_S$ with an instantaneous value of 1 V.

At this point, the first charging and recharging cycle should take place again, as explained above, and therefore, first the charging switch 3 is closed for a charging time $t_L$, and then, after the charging switch 3 has been re-opened, the recharging switch 4 is closed for the recharging time $T_U$.

While, before closing the charging switch 3, the first electrode of the sensor capacitor 1 has the ground potential 11 and the second electrode 10 of the sensor capacitor 1 has the LF noise voltage potential $P_S$ with an instantaneous value of 1 V, and the sensor capacitor 1, seen from the first electrode 9 to the second electrode 10, is therefore charged to −1 V, closing of the charging switch 3 results in the first electrode 9 of the sensor capacitor 1 having an operating voltage potential $P_{UB}$ of 5 V, while the second electrode 10 of the sensor capacitor 1, as before, should have a LF noise voltage potential $P_S$ with an instantaneous value of 1 V. While, before closing the charging switch 3, the sensor capacitor 1, viewed from the first electrode 9 to the second electrode 10, is charged to −1 V, the sensor capacitor 1, after closing the charging switch 3, and the directly following charging of the sensor capacitor 1 is charged to +4 V, in turn, viewed from the first electrode 9 to the second electrode 10. The charge which is necessary to recharge the sensor capacitor 1 from −1 V to +4 V is the same as that necessary to charge an uncharged sensor capacitor 1 from 0 V to +5V. The charge which flows from the voltage source 2 via the charging switch 3 into the sensor capacitor leaves the storage capacitor 6 uninfluenced.

As was explained above, the closing of the charging switch 3 results not only in what was described directly above, but also now, a current, caused by the time change of the LF noise voltage $U_S$, flows through the noise voltage compensation capacitor 16, the storage capacitor 6, the closed charging switch 3 and the voltage source 2 back to the LF noise voltage source 15. Thus, charge flows into the storage capacitor 6. Since this charge, in turn, has nothing to do with the operating voltage $U_B$ of the voltage source 2, this transport of charge to the storage capacitor 6 or into the storage capacitor 6 will again be called the LF noise voltage fault charge.

As was previously explained above in conjunction with FIG. 2, the time change of the LF noise voltage $U_S$ is the cause of the LF noise voltage fault current which flows via the sensor capacitor 1 and via the storage capacitor 6, and the accompanying transport of charge to the storage capacitor 6 is called the LF noise voltage fault charge. This LF noise voltage fault charge is formed during the recharging cycle. Therefore, with the recharging switch 4 closed, it is rectified with the operationally intended recharging of the charge from the sensor capacitor 1 into the storage capacitor 6 when the time change of the LF noise voltage $U_S$ is positive, and is hereinafter called the positive LF noise voltage fault charge. During the recharging cycle, with the recharging switch 4 closed, a current caused by the time change of the LF noise voltage $U_S$ also flows via the noise voltage compensation capacitor 16 and the closed recharging switch 4.

This current leaves the storage capacitor 6 and the charge in the storage capacitor 6 unaffected, and can therefore remain ignored.

As was previously explained regarding the teaching of the invention and in conjunction with FIG. 3, the time change of the LF noise voltage $U_S$ is also the cause of a LF noise voltage fault current which flows via the noise voltage compensation capacitor 16 and via the storage capacitor 6, and the accompanying transport of charge to the storage capacitor 6 is called the LF noise voltage fault charge. This LF noise voltage fault charge is formed during the charging cycle, therefore with the charging switch 3 closed. It is directed opposite to the operationally intended recharging of the charge from the sensor capacitor 1 into the storage capacitor 6, and therefore, is hereinafter called the negative LF noise voltage fault charge.

At this point, if the sensor capacitor 1 and the noise voltage compensation capacitor 16 are made identical and can be influenced in the same way by the time change of the LF noise voltage $U_S$, the positive LF noise voltage fault charge and the negative LF noise voltage fault charge are quantitatively the same. Therefore, they are compensated via a charging and recharging cycle or over the measurement time $t_{MZ}$ so that the adulteration of the measurement result explained above by LF noise voltages is eliminated by the noise voltage compensation capacitor 16 which is connected in accordance with the invention and which is provided according to the invention.

In the circuit arrangement of the invention, preferably, the sensor capacitor 1 and the noise voltage compensation capacitor 16 are made and arranged such that there is no directionally selective preference (i.e., polarity preference) with regard to influence by the LF noise voltage.

It was assumed that the charging time $t_L$ and the recharging time $T_U$ are the same. If this is not the case, provisions must be made for the ratio of the capacitance of the sensor capacitor 1 to the capacitance of the noise voltage compensation capacitor 16 to be proportional to the ratio of the charging time to the recharging time.

FIG. 3, in addition to the sensor capacitor 1, shows still other sensor capacitors 1a, 1b, and in addition to the noise voltage compensation capacitor 16, still other noise voltage compensation capacitors 16a, 16b, the sensor capacitors 1, 1a and 1b and the noise voltage compensation capacitors 16, 16a, 16b, each being connected in parallel. Therefore, the effective capacitance results from the sum of the capacitances of the sensor capacitors 1, 1a, 1b or from the sum of the capacitances of the noise voltage compensation capacitors 16, 16a and 16b. Such an embodiment can be recommended if the electrode of a capacitive proximity switch or a capacitive fill level sensor is present as the capacitive circuit element or component.

What is claimed is:

1. Circuit arrangement for detecting the capacitance or capacitance change of a capacitive circuit element or component, comprising:
    a voltage source,
    at least one charging switch, at least one discharging switch and at least one recharging switch,
    a control device which controls the charging switch and the recharging switch and which contains a clock generator,
    a storage capacitor, and
    an evaluation circuit which is connected to the storage capacitor,
    wherein the voltage source is connectable to a first electrode of the capacitive circuit element or component via the charging switch in a closed position of the charging switch,
    wherein a second electrode of the capacitive circuit element or component is connected or connectable to a terminal of the voltage source, which terminal is away from the charging switch, so that the capacitive circuit element or component is charged by the voltage source when the charging switch is closed,
    wherein the storage capacitor is connected to the recharging switch and the discharging switch such that the storage capacitor is completely discharged when the recharging switch and the discharging switch are closed and the charging switch is open,
    wherein an electrode of the storage capacitor is connected or connectable to the electrode of the capacitive circuit element or component which is connected to the charging switch, and the second electrode of the storage capacitor is connectable via the closed recharging switch to the second electrode of the capacitive circuit element or component so that the capacitive circuit element or component is discharged onto the storage capacitor or the charge stored in the capacitive circuit element or component is recharged into the storage capacitor when the discharging switch and the charging switch are opened and the recharging switch is closed, and
    wherein the evaluation circuit is able to determine the capacitance or capacitance change of the capacitive circuit element or component from the voltage on the storage capacitor after a certain number of charging and recharging cycles,
    wherein a capacitive noise voltage compensation element is provided which has a noise voltage compensation electrode connected to the second electrode of the storage capacitor, a second noise voltage compensation electrode connected to the second electrode of the capacitive circuit element or component, and
    wherein the noise voltage compensation element is arranged to be influenced by LF noise voltage in the same way as the capacitive circuit element or component.

2. Circuit arrangement as claimed in claim 1, wherein the capacitive circuit element or component and the capacitive noise voltage compensation element are made and arranged such that there is no directionally selective preference with regard to influence by the LF noise voltage.

3. Circuit arrangement as claimed in claim 1, wherein the charging switch is closed for a charging time ($t_L$) and the recharging switch is closed for a recharging time ($t_U$), and wherein the charging time ($t_L$) and the recharging time ($t_U$) are the same.

4. Circuit arrangement as claimed in claim 1, wherein, if the charging switch is closed for a charging time ($t_L$) and the recharging switch is closed for a recharging time ($t_U$), and charging time ($t_L$) and the recharging time ($t_U$) are not the same, then the ratio of the capacitance of the capacitive circuit element or component to the capacitance of the capacitive noise voltage compensation element is proportional to the ratio of the charging time ($t_L$) to the recharging time ($t_U$).

5. Circuit arrangement as claimed in claim 1, wherein there are several capacitive circuit elements or components and several capacitive noise voltage compensation elements.

6. Circuit arrangement as claimed in claim 5, wherein the capacitive circuit elements or components and the capacitive noise voltage compensation elements are connected in parallel.

* * * * *